(12) United States Patent
Hsu et al.

(10) Patent No.: US 6,849,891 B1
(45) Date of Patent: Feb. 1, 2005

(54) RRAM MEMORY CELL ELECTRODES

(75) Inventors: Sheng Teng Hsu, Camas, WA (US); Wei Pan, Vancouver, WA (US); Fengyan Zhang, Vancouver, WA (US); Wei-Wei Zhuang, Vancouver, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/730,584

(22) Filed: Dec. 8, 2003

(51) Int. Cl.[7] .............................................. H01L 29/94
(52) U.S. Cl. ........................ 257/296; 257/44; 257/192; 257/310; 360/324; 360/326
(58) Field of Search ......................... 257/44, 192, 296, 257/310; 360/324, 326

(56) References Cited

U.S. PATENT DOCUMENTS 5,504,041 A * 4/1996 Summerfelt ................ 438/396
6,723,643 B1 * 4/2004 Pan et al. .................... 438/689

OTHER PUBLICATIONS

Liu et al., *Electrical–pulse–induced reversible resistance change effect in magnetoresistive films* Applied Physics Letters. vol. 76, #19, p. 2749–2751; May, 2000.

* cited by examiner

*Primary Examiner*—Nathan J. Flynn

*Assistant Examiner*—Scott R. Wilson

(74) *Attorney, Agent, or Firm*—David C. Ripma; Matthew D. Rabdau; Joseph P. Curtin

(57) ABSTRACT

A RRAM memory cell is formed on a silicon substrate having a operative junction therein and a metal plug formed thereon, includes a first oxidation resistive layer; a first refractory metal layer; a CMR layer; a second refractory metal layer; and a second oxidation resistive layer. A method of fabricating a multi-layer electrode RRAM memory cell includes preparing a silicon substrate; forming a junction in the substrate taken from the group of junctions consisting of N+ junctions and P+ junctions; depositing a metal plug on the junction; depositing a first oxidation resistant layer on the metal plug; depositing a first refractory metal layer on the first oxidation resistant layer; depositing a CMR layer on the first refractory metal layer; depositing a second refractory metal layer on the CMR layer; depositing a second oxidation resistant layer on the second refractory metal layer; and completing the RRAM memory cell.

14 Claims, 2 Drawing Sheets

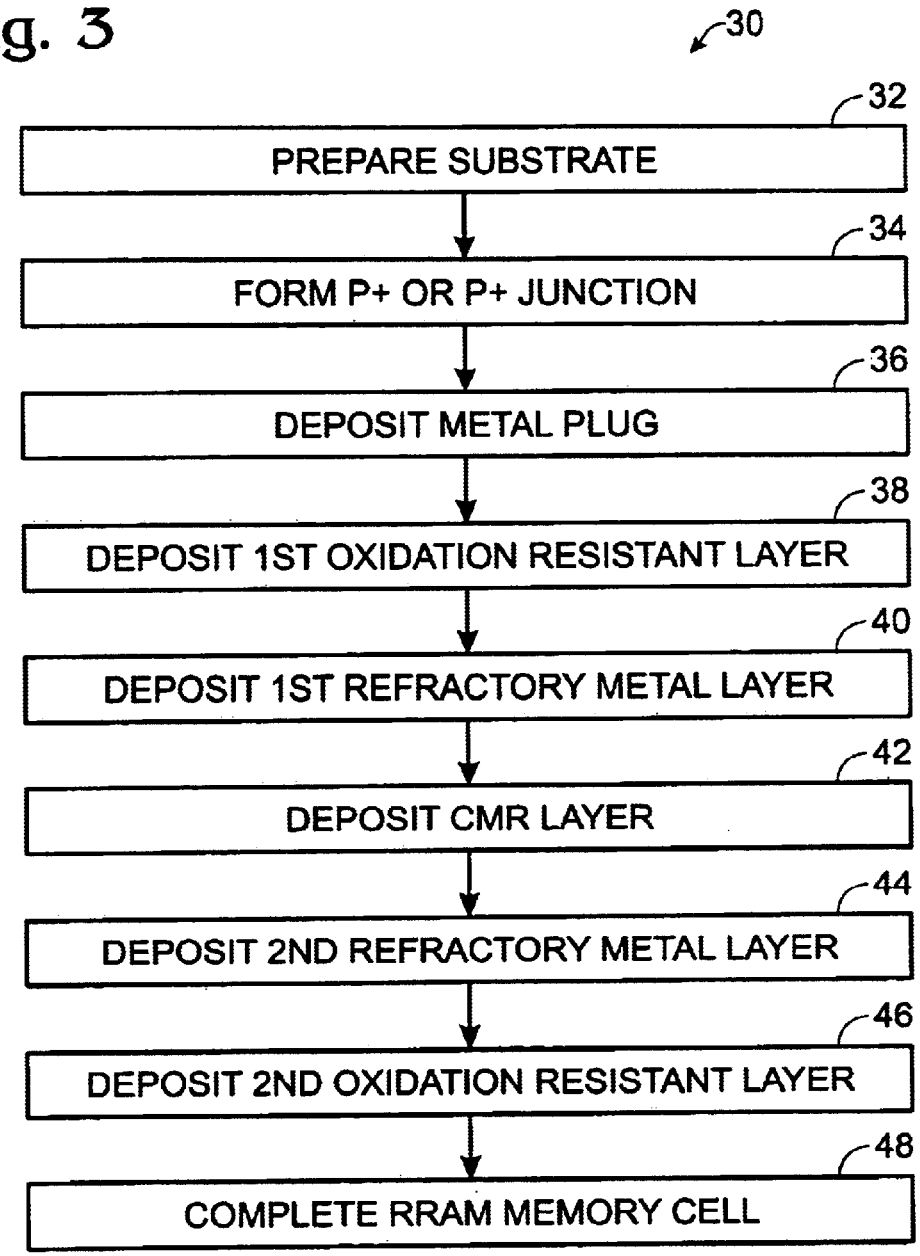

RRAM MEMORY CELL ELECTRODES

FIELD OF THE INVENTION

The present invention relates to thin film resistance memory device for non-volatile memory array, and specifically to a multi-layer electrode for a RRAM memory cell.

BACKGROUND OF THE INVENTION

There is no commercial RRAM device available at this time, however, experimental devices, using Pt, Au, Ag, Al, Ti, and TiN electrode have been developed. Pt, Au, and Ag electrode devices exhibit good endurance, however, electrodes formed of these materials cannot be etched using conventional integrated circuit etching processes. The experimental devices are fabricated using shallow mask or chemical mechanical polishing (CMP) processes, which are neither suitable nor cost effective for sub-micron, large-scale memory device fabrication. Other electrode materials which have been used in experimental devices demonstrate poor reliability and poor endurance. Liu et al., *Electrical-pulse-induced reversible resistance change effect in magnetoresistive films* Applied Physics Letters. Vol.76, #19, p.2749–2751; May, 2000. This invention provides a reliable electrode structure to improve the device reliability, endurance, at the same time reducing fabrication cost.

SUMMARY OF THE INVENTION

A RRAM memory cell formed on a silicon substrate having a operative junction therein and a metal plug formed thereon, includes a first oxidation resistive layer; a first refractory metal layer; a CMR layer; a second refractory metal layer; and a second oxidation resistive layer.

A method of fabricating a multi-layer electrode RRAM memory cell includes preparing a silicon substrate; forming a junction in the substrate taken from the group of junctions consisting of N+ junctions and P+ junctions; depositing a metal plug on the junction; depositing a first oxidation resistant layer on the metal plug; depositing a first refractory metal layer on the first oxidation resistant layer; depositing a CMR layer on the first refractory metal layer; depositing a second refractory metal layer on the CMR layer, depositing a second oxidation resistant layer on the second refractory metal layer; and completing the RRAM memory cell.

It is an object of the invention to provide a reliable electrode to improve device reliability and device endurance, and which is capable of being produced economically.

Another object of the invention is to provide a multi-layer electrode which is oxidation resistant.

A further object of the invention is to provide a metal electrode for an RRAM.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 3 is a block diagram of the method of the invention.

DETAILED DESCRIPTION OF THE PREFERRED EMBODIMENTS

Experimental data demonstrates that, during programming, the resistivity of RRAM material near the cathode is switched to a high resistivity state while that near the anode is switched to low resistivity state. The conversion of the resistivity occurs during the instance when a narrow voltage pulse is applied to the device, which causes a voltage drop near the cathode. There is a clear onset voltage required for the resistivity changes. It is also experimentally found that the material needs a certain oxygen contend, as when the oxygen content is too low, there is no resistivity change.

Figure 1:
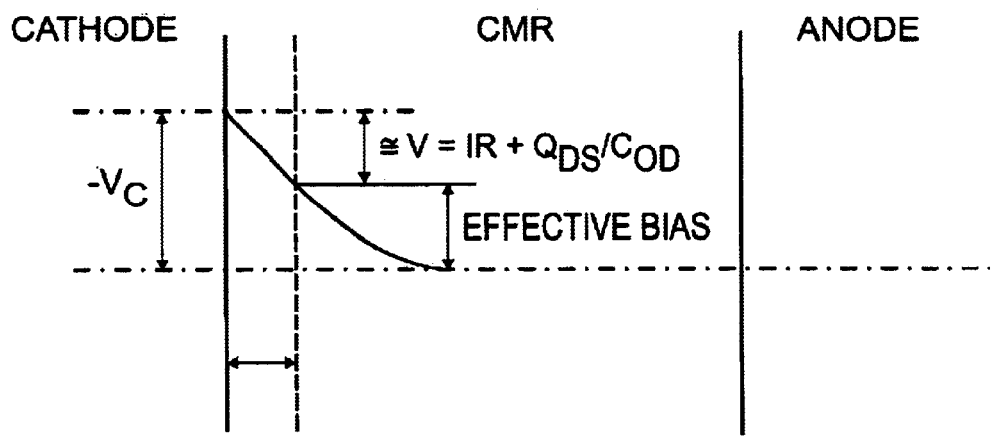
FIG. 1 depicts resistance properties of an RRAM memory cell.

If the electrode of a RRAM memory cell is not oxidation resistive, the electrode will be oxidized during the fabrication process temperature treatment, or will be gradually oxidized by the current-voltage-generated heat during normal operation. At the same time that electrode oxidation occurs, oxygen diffuses from the RRAM material to the electrode, causing an oxygen deficit region. Both the oxidized electrode and the oxygen deficit region have high resistance. In addition, the oxygen deficit region cannot be changed to the low resistance state by electrical pulse, as is illustrated in FIG. 1. The effective voltage applied to the cathode is therefore, given by:

$$V_{EFF} = V_C - IR - \frac{Q_{DS}}{C_{OD}}$$

Where I is the current flow through the device, R is the series resistance in the oxidized electrode and the oxygen deficit region of the memory material, $Q_{DS}$ is the net charge in the depletion region and $C_{OD}$ is the series capacitance of the oxygen deficit region capacitance and the oxidized electrode capacitance. The above equation demonstrates that the effective programming voltage may be significantly reduced by the oxidation of the electrode.

As previously described, a sub-micron size Pt electrode may be formed by chemical mechanical polishing (CMP) processes. The disadvantage is cost. CMP requires planarization of the wafer surface, formation of an oxide trench, and a CMP process. In addition, Pt is not able to block oxygen diffusion, and loss of oxygen and the formation of oxygen deficit region still may occur.

Figure 2:
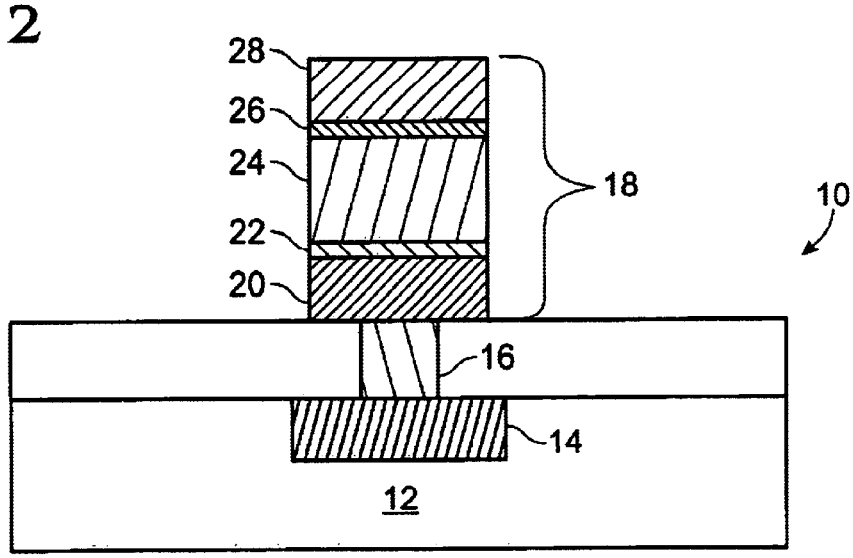
FIG. 2 depicts the RRAM multi-layer electrode of the invention.

A RRAM electrode must not react with the resistor material. A noble metal electrode is preferred. However, most of the noble metals do not block oxygen diffusion. Therefore, a multi-layer electrode, as shown in FIG. 2, generally at 10, is required. FIG. 2 depicts a substrate 12, having a N+ or P+ junction formed therein, a metal ply 16 extends upwards from junction 16 through an oxide layer to a multi-layer electrode RRAM memory cell 18. RRAM memory cell 18 includes layers of oxidation resistant material, 20 and 28, refractory metal layers 22 and 26, and a layer of metal, specifically, in the preferred embodiment, a layer of colossal magnetoresistive (CMR) material 24.

Layers 20, 28 are formed of an oxidation resistance material, such as TiN, TaN, TiAlN$_x$, TaAlN$_x$, TaSiN, TiSiN, and RuTiN. The thickness of layers 20, 28, also referred to herein as first and second oxidation resistant layers, respectively, is between about 50 nm to 300 nm. Layers 20, 28 may be etched using any conventional dry etch process.

Layers 22, 26 are formed of a refractory metal, such as Pt, Ir, IrO$_2$, Ru, RuO$_2$, Au, Ag, Rh, Pd, Ni, and Co. The thickness of layers 22, 26, also referred to herein as first and second refractory metal layers, respectively, is between about 3 nm to 50 nm. Because layers 22, 26 are very thin, they may be dry etched using a partial sputtering process without excessive degradation of the mask material and re-deposition of the etched material. Although it is preferred to have dual metal electrode for both cathode and anode, as is sketched in FIG. 2, a RRAM cell with only one dual metal electrode is reliable for certain applications.

CMR layer 24 may be formed of any CMR material, such as PCMO (Pr$_{0.7}$Ca$_{0.3}$MnO$_3$), LPCMO, or high-temperature superconductor materials, etc., and may be deposited by sputtering, metal organic chemical vapor deposition (MOCVD) or metal oxide deposition (MOD), including spin-coating. The CMR layer has a thickness of between about 50 nm to 300 nm.

Referring now to FIG. 3, the method of the invention is shown generally at 30, and includes preparing the substrate, 32, and forming a N+ or P+ junction therein, 34. A metal plug 16 is deposited 36 by sputtering, and may be formed of tungsten or copper. Metal plug 16 is patterned and etched, and then surrounded by an oxide layer, which is next deposited about metal plug 16.

A first oxidation resistant layer is deposited, 38, followed by deposition of a first refractory metal layer, 40. The CMR layer is then deposited, 42. A second refractory metal layer is deposited, 44, followed by deposition of a second oxidation resistant layer, 46. The RRAM memory cell may then be completed according to well known techniques, 48.

Thus, a method of fabrication of a RRAM memory cell electrode has been disclosed. It will be appreciated that further variations and modifications thereof may be made within the scope of the invention as defined in the appended claims.

We claim:

1. A RRAM memory cell formed on a silicon substrate having a operative junction formed therein and a metal plug formed on the operative junction, comprising:
   a stack of the following layers, wherein each layer has the same horizontally disposed size as an immediately underlying layer;
   a first oxidation resistive layer formed on the metal plug;
   a first refractory metal layer formed on the oxidation resistive layer;
   a CMR layer formed on the first refractory metal layer;
   a second refractory metal layer formed on the CMR layer; and
   a second oxidation resistive layer formed on the second refractory metal layer;
   wherein "on" means directly on without any intervening structures.

2. The RRAM memory cell of claim 1 wherein the oxidation resistive layer are formed of a material taken from the group of materials consisting of TiN, TaN, TiAlN$_x$, TaAlN$_x$, TaSiN, TiSiN, and RuTiN.

3. The RRAM memory cell of claim 2 wherein the oxidation resistive layers have a thickness of between about 50 nm to 300 nm.

4. The RRAM memory cell of claim 1 wherein the refractory metal layers are formed of a material taken from the group of materials consisting of Pt, Ir, IrO$_2$, Ru, RuO$_2$, Au, Ag, Rh, Pd, Ni, and Co.

5. The RRAM memory cell of claim 4 wherein the refractory metal layers have a thickness of between about 3 nm to 50 nm.

6. The RAM memory cell of claim 1 wherein the CMR layer is formed of a material taken from the group of material consisting of CMR materials and high-temperature superconductors.

7. The RRAM memory cell of claim 6 wherein the CMR layer has a thickness of between about 50 nm to 300 nm.

8. A method of fabricating a multi-layer electrode RRAM memory cell comprising:
   preparing a silicon substrate;
   forming a junction in the substrate taken from the group of junctions consisting of N+ junctions and P+ junctions;
   depositing a metal plug on the junction;
   depositing a first oxidation resistant layer on the metal plug;
   depositing a first refractory metal layer on the first oxidation resistant layer;
   depositing a CMR layer on the first refractory metal layer;
   depositing a second refractory metal layer on the CMR layer;
   depositing a second oxidation resistant layer on the second refractory metal layer; and
   completing the RRAM memory cell.

9. The method of claim 8 wherein said depositing the oxidation resistive layers includes depositing a material taken from the group of materials consisting of TiN, TaN, TiAlN$_x$, TaAlN$_x$, TaSiN, TiSiN, and RuTiN.

10. The method of claim 9 wherein said depositing the oxidation resistive layers includes depositing the oxidation resistive layers to a thickness of between about 50 nm to 300 nm.

11. The method of claim 8 wherein said depositing the refractory metal layers includes depositing a material taken from the group of materials consisting of Pt, Ir, IrO$_2$, Ru, RuO$_2$, Au, Ag, Rh, Pd, Ni, and Co.

12. The method of claim 11 wherein said depositing the refractory metal layers includes depositing the refractory metal to a thickness of between about 3 nm to 50 nm.

13. The method of claim 8 wherein said depositing a CMR layer includes depositing a layer of CMR material taken from the group of material consisting of PCMO, LPCMO and high-temperature superconductors.

14. The method of 13 wherein said depositing a CMR layer includes depositing a layer of CMR material having a thickness of between about 50 nm to 300 nm.

* * * * *